US010705633B2

(12) United States Patent
Wu

(10) Patent No.: US 10,705,633 B2
(45) Date of Patent: Jul. 7, 2020

(54) DISPLAY PANEL

(71) Applicant: AU Optronics Corporation, Hsin-Chu (TW)

(72) Inventor: Tsung-Tien Wu, Hsin-Chu (TW)

(73) Assignee: AU OPTRONICS CORPORATION, Hsin-Chu (TW)

(*) Notice: Subject to any disclaimer, the term of this patent is extended or adjusted under 35 U.S.C. 154(b) by 475 days.

(21) Appl. No.: 15/464,868

(22) Filed: Mar. 21, 2017

(65) Prior Publication Data
US 2017/0277315 A1    Sep. 28, 2017

(30) Foreign Application Priority Data

Mar. 22, 2016 (TW) .............................. 105108841 A

(51) Int. Cl.
G06F 3/041 (2006.01)
G06F 3/044 (2006.01)
(Continued)

(52) U.S. Cl.
CPC ............ *G06F 3/0412* (2013.01); *G06F 3/044* (2013.01); *G09G 3/32* (2013.01); *G09G 2310/08* (2013.01); *G09G 2354/00* (2013.01); *H01L 25/167* (2013.01); *H01L 27/124* (2013.01); *H01L 27/323* (2013.01)

(58) Field of Classification Search
CPC ......... G06F 3/0412; G06F 3/044; G09G 3/32; G09G 2310/08; G09G 2354/00; H01L 27/323
See application file for complete search history.

(56) References Cited

U.S. PATENT DOCUMENTS 6,414,719 B1 * 7/2002 Parikh .................... H04N 5/21
348/448
6,618,029 B1    9/2003 Ozawa
(Continued)

FOREIGN PATENT DOCUMENTS

CN    1231046 A    10/1999
CN    103984442 A    8/2014
CN    103576360 B    6/2016

OTHER PUBLICATIONS

China Patent Office "Office Action" dated Aug. 2, 2018, China.

Primary Examiner — Antonio Xavier
(74) Attorney, Agent, or Firm — WPAT, PC

(57) ABSTRACT

The present disclosure provides a display panel, which includes a first light-emitting unit, a first electrode line A, a second light-emitting unit, a second electrode line A, and a first electrode line B. The first light-emitting unit includes a first electrode A and a first electrode B located at both ends of the first light-emitting unit respectively. The first electrode line A is connected to the first electrode A. The second light-emitting unit is located on a first side of the first light-emitting unit and includes a second electrode A and a second electrode B located at both ends of the second light-emitting unit respectively. The second electrode line A is connected to the second electrode A, and the second electrode line A and the first electrode line A are independent in terms of signal. The first electrode line B is arranged between the first light-emitting unit and the second light-emitting unit and connected to the first electrode B and the second electrode B respectively.

15 Claims, 11 Drawing Sheets

(51) Int. Cl.
G09G 3/32 (2016.01)
H01L 25/16 (2006.01)
H01L 27/12 (2006.01)
H01L 27/32 (2006.01)

(56) References Cited

U.S. PATENT DOCUMENTS

| | | | |
|---|---|---|---|
| 9,318,047 B2 | 4/2016 | Hsu et al. | |
| 2009/0135166 A1* | 5/2009 | Uchino | G09G 3/006 345/205 |
| 2010/0201903 A1* | 8/2010 | Huang | G02F 1/136259 349/55 |
| 2014/0253493 A1* | 9/2014 | Cho | G06F 3/0412 345/174 |
| 2014/0313169 A1* | 10/2014 | Kravets | G06F 3/044 345/178 |
| 2015/0085206 A1* | 3/2015 | Lee | G02F 1/13338 349/12 |
| 2015/0185568 A1* | 7/2015 | Zheng | G02F 1/136209 349/43 |
| 2015/0187851 A1* | 7/2015 | Lee | H01L 27/326 257/40 |
| 2015/0332627 A1* | 11/2015 | Ma | G09G 3/3233 345/204 |
| 2016/0188083 A1* | 6/2016 | Shi | G06F 3/044 345/174 |

\* cited by examiner

DISPLAY PANEL

RELATED APPLICATIONS

This application claims priority to Taiwan Application Serial Number 105108841, filed Mar. 22, 2016, which are herein incorporated by reference.

TECHNICAL FIELD

The present disclosure relates to a display panel, and more particularly relates to a self-emission display panel.

BACKGROUND

As compared with a conventional liquid crystal display (LCD), a self-emission display does not need a backlight module; therefore, the self-emission display may be made to be more lightweight and thin, larger viewing angle, and high response speed, and can be electrically saved. In various types of self-emission displays, it already becomes a mainstream of development to use a light-emitting diode (LED) as a light source.

Generally, a capacitive touch screen includes a display panel and a capacitive touch panel. A sensing manner of a capacitive touch panel may include self capacitance sensing and mutual capacitance sensing. As shown in FIG. 1A and FIG. 1B, FIG. 1A is a schematic diagram of self capacitance sensing of a capacitive touch panel. A control chip 502 charges a sampling capacitor 504 by using a driving signal 503. When a finger touches a covering glass 500, a coupling effect occurs between an electrode 501 and the finger, and charges on the sampling capacitor 504 are dispersed to make a potential of the sampling capacitor 504 decrease. When the control chip 502 senses the potential of the sampling capacitor 504 decreases below a threshold potential, the capacitive touch panel is regarded as sensing a touch control event. In another aspect, FIG. 1B is a schematic diagram of mutual capacitance sensing of a capacitive touch panel. As compared with the touch panel in FIG. 1A, the touch panel in FIG. 1B has two electrodes 511, 512. The electrode 511 is used to receive a scanning signal 514 output from a drive buffer apparatus 513, and the electrode 512 is used to generate a sensing signal. When a finger touches the covering glass 510, a coupling effect occurs between the electrode 511 and the finger, so that a capacitance between the electrode 511 and the electrode 512 changes. In this way, the electrode 512 generates a sensing signal accordingly to localize where to be touched.

However, if the display panel is equipped with the capacitive touch panel (that is, the display panel is attached externally to the capacitive touch panel), multiple layers of glass are needed, which greatly increases the thickness of a capacitive touch screen. Moreover, a process of a conventional capacitive touch screen is more complex than that of a common display panel without touch control, and a yield of the conventional capacitive touch screen is also relatively low. Therefore, how to integrate a touch display panel (that is, a display panel is equipped (in cell) with a touch panel (electrode)) to provide a relatively simple process and a thinner overall thickness is one of the important development topics at present.

SUMMARY

The present disclosure provides a display panel, which can effectively reduce a number of wires and increases flexibility of space distribution, thereby increasing a utilization rate of an area.

The present disclosure provides a display panel, which the resolution of a touch panel can be effectively improved.

The present disclosure provides a display panel, which includes a first light-emitting unit, a first electrode line A, a second light-emitting unit, a third light-emitting unit, a fourth light-emitting unit, and a first electrode line B. The first light-emitting unit includes a first electrode A and a first electrode B located at both ends of the first light-emitting unit respectively. The first electrode line A is electrically connected to the first electrode A. The second light-emitting unit is located on a first side of the first light-emitting unit, and the first light-emitting unit and the second light-emitting unit are located in a same linear direction. The second light-emitting unit includes a second electrode A and a second electrode B located at both ends of the second light-emitting unit respectively. The first electrode A is located at an end of the first light-emitting unit where is away from the second light-emitting unit. The first electrode B is located at another end of the first light-emitting unit where is toward to the second light-emitting unit. The second electrode A is located at an end of the second light-emitting unit where is away from the first light-emitting unit. The second electrode B is located at another end of the second light-emitting unit where is toward to the first light-emitting unit. The third light-emitting unit is located on a second side of the first light-emitting unit, and the second side is substantially perpendicular to the first side. The third light-emitting unit includes a third electrode A and a third electrode B located at both ends of the third light-emitting unit respectively. The fourth light-emitting unit is located on a side of the third light-emitting unit, and is adjacent to the second light-emitting unit. The fourth light-emitting unit includes a fourth electrode A and a fourth electrode B located at both ends of the fourth light-emitting unit respectively. The third electrode A is located at an end of the third light-emitting unit where is away from the fourth light-emitting unit. The third electrode B is located at another end of the third light-emitting unit where is toward to the fourth light-emitting unit. The fourth electrode A is located at an end of the fourth light-emitting unit where is away from the third light-emitting unit. The fourth electrode B is located at another end of the fourth light-emitting unit where is toward to the third light-emitting unit. The first electrode line B is arranged between the first light-emitting unit, the second light-emitting unit, the third light-emitting unit, and the fourth light-emitting unit, and connected to the first electrode B, the second electrode B, the third electrode B, and the fourth electrode B respectively. The first electrode line B extends from between the first light-emitting unit and the second light-emitting unit to between the third light-emitting unit and the fourth light-emitting unit.

DETAILED DESCRIPTION

Figure 1A:
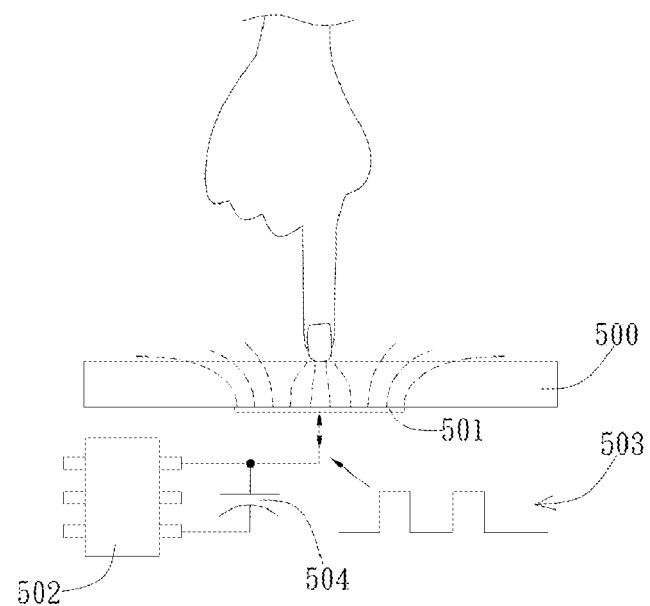
FIG. 1A is a schematic diagram of self capacitance sensing of a capacitive touch panel.
Figure 1B:
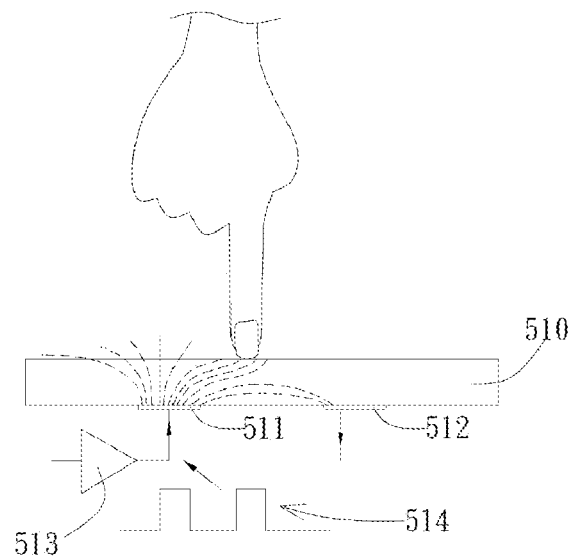
FIG. 1B is a schematic diagram of mutual capacitance sensing of a capacitive touch panel.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, "connected" may refer to a physical and/or electrical connection.

"About" or "substantially/approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, ±5%, ±3% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
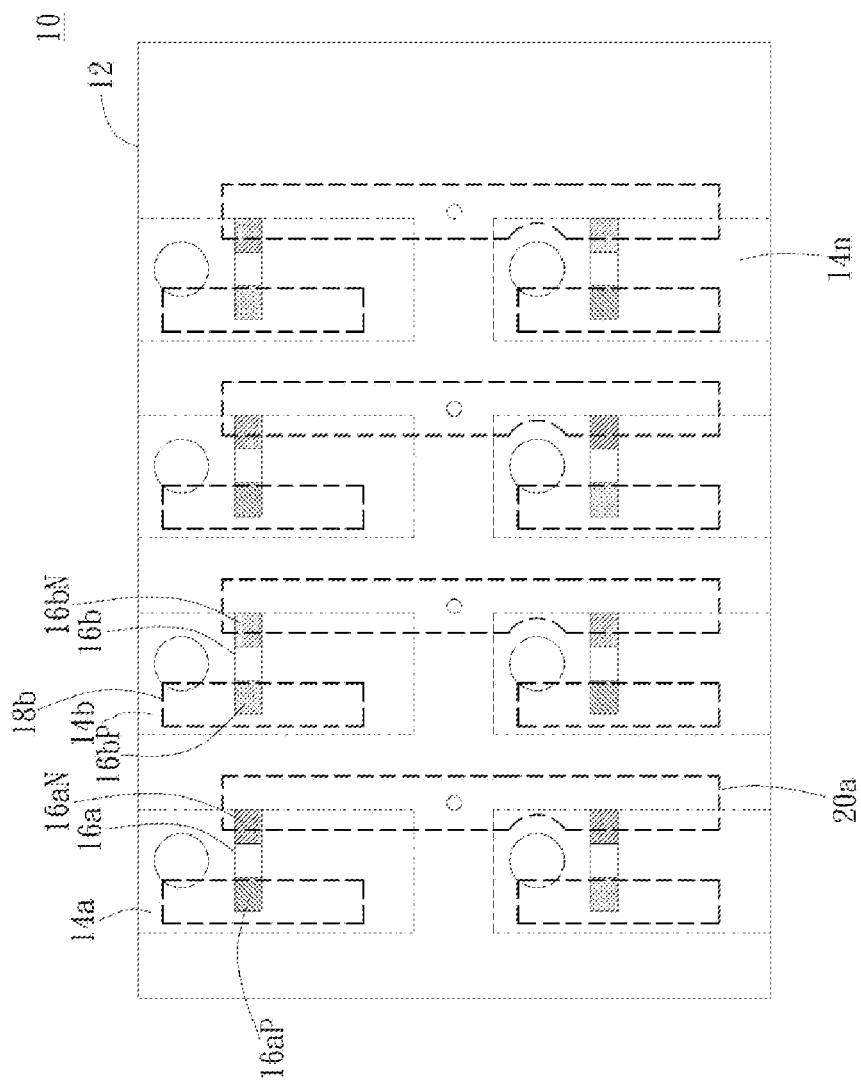
FIG. 2 is a partial schematic diagram of arrangement of elements according to a comparative embodiment of the present disclosure.

Referring to FIG. 2, FIG. 2 is a partial schematic diagram of arrangement of light-emitting elements of a self-emission display panel. As shown in FIG. 2, a display panel 10 includes a driving substrate 12. A driving circuit (not shown) is disposed on the driving substrate 12. That is to say the driving circuit is disposed on a substrate (not represented), and a plurality of subpixel areas 14a to 14n arranged in an array manner is disposed on a surface (such as an inner surface) of the driving circuit. At least one LED 16a to 16n is disposed in each subpixel area 14a to 14n respectively. Each LED 16a to 16n includes a P type electrode and an N type electrode. For example, the LED 16a includes a P type electrode 16aP and an N type electrode 16aN. The LED 16b includes a P type electrode 16bP and an N type electrode 16bN. For the LEDs 16a to 16n in the present disclosure, micrometer-scale to nanometer-scale LEDs are used as an example, and such an LED may be referred to as a micro-LED or a nano-LED; however, the present disclosure is not limited thereto. In another embodiment, the type and a quantity of the LEDs 16a to 16n as an example of one inorganic LED is used but the present disclosure is not limited thereto. In another embodiment, the LEDs 16a to 16n may be organic LEDs, organic-inorganic hybrid LEDs, or other suitable type. The quantity of the LEDs 16a to 16n may be 2, 3, 4, and the like. The quantity of the LEDs 16a to 16n is arranged according to the size of each subpixel area 14a to 14n.

As shown in FIG. 2, in a layout arrangement of LEDs in a comparative embodiment of the present disclosure. The same polarity electrodes of each LED 16a to 16n in the corresponding subpixel area 14a to 14n are arranged in the same way (or namely in the same direction). For example, the N type electrode 16aN of the LED 16a is disposed on a right side of the corresponding subpixel area 14a, and the P type electrode 16aP is disposed on a left side of the corresponding subpixel area 14a, and so on. Therefore, two transversely adjacent LEDs, for example, the LED 16a and the LED 16b, the N type electrode 16aN of the LED 16a and the P type electrode 16bP of the LED 16b are located on the same side. In this design, to prevent a short-circuit from occurring between an N electrode and a P electrode in two transversely adjacent LEDs, for example, the LEDs 16a and 16b, a space between subpixel area 14a and 14b is reserved for two electrode lines, an N type electrode line 20a and a P type electrode line 18b, resulting in that distribution flexibility of an overall space range is limited, and the quantity of subpixel areas that can be configured in each inch may be reduced, (for example, low PPI (sub-pixels per inch)).

Figure 3:
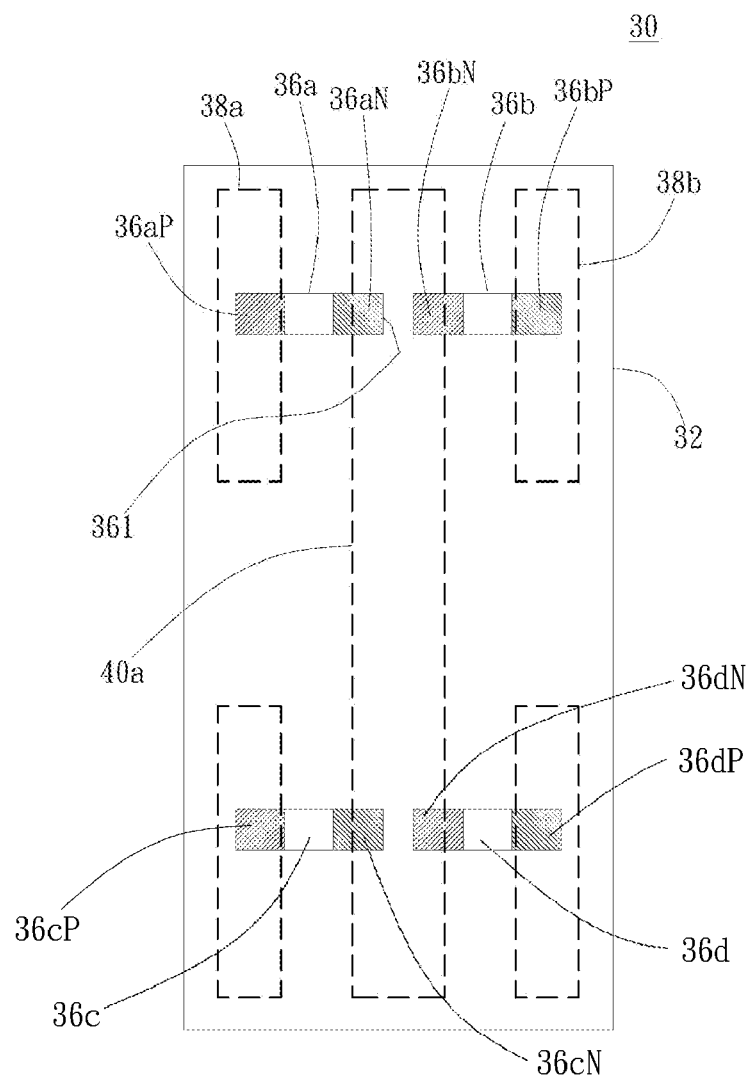
FIG. 3 is a partial schematic diagram of arrangement of elements of a display panel according to a first preferred embodiment of the present disclosure.

Referring to FIG. 3, FIG. 3 is a partial schematic diagram of arrangement of elements of a display panel according to a first preferred embodiment of the present disclosure. As shown in FIG. 3, a display panel 30 of the present disclosure includes a driving substrate 32. A driving circuit (not shown) is disposed on the driving substrate 32, that is, the driving circuit is disposed on a substrate (not marked), where the display panel 30 is preferably a self-emission display. A plurality of light-emitting units is disposed on the driving substrate 32, and preferably, is arranged in an array manner. In this embodiment, a first light-emitting unit 36a and a second light-emitting unit 36b are used as an example for description. The first light-emitting unit 36a and the second light-emitting unit 36b are preferably light emitting diodes (LEDs) whose side lengths of the LEDs are less than 10 micrometers (μm), that is, micrometer-scale LEDs to nanometer-scale LEDs. However, the present disclosure is not limited thereto. The type and the quantity or other related description of the LEDs can refer to the content of FIG. 2, and thus may not be repeated herein in detail.

The first light-emitting unit 36a includes a first electrode A 36aP and a first electrode B 36aN located at both ends of the first light-emitting unit 36a respectively. The both ends (or namely two ends) of the first light-emitting unit 36a are disposed opposite each other on inner surfaces of driving substrates 32, and the first electrode A 36aP and the first electrode B 36aN are disposed on the first light-emitting unit 36a respectively. The second light-emitting unit 36b includes a second electrode A 36bP and a second electrode B 36bN located at both ends (or namely two ends) of the second light-emitting unit 36b respectively, and the second light-emitting unit 36b is located on a first side (for example, a right side) 361 of the first light-emitting unit 36a. In this embodiment, the first side 361 refers to a side near the first electrode B 36aN of the first light-emitting unit 36a. In addition, in this embodiment, an electrode A refers to a P type electrode, and an electrode B refers to an N type electrode; however, the present disclosure is not limited thereto.

Further, the first electrode A 36aP is located at an end of the first light-emitting unit 36a, and the end of the first light-emitting unit 36a is away from the second light-emitting unit 36b. The first electrode B 36aN is located at another end of the first light-emitting unit 36a, and the another end of the first light-emitting unit 36a is toward to (for example: adjacent to) the second light-emitting unit 36b. The second electrode A 36bP is located at an end of the second light-emitting unit 36b, and the end of of the second light-emitting unit 36b is away from the first light-emitting unit 36a. The second electrode B 36bN is located at another end of the second light-emitting unit 36b, and the another end of the second light-emitting unit 36b is toward to (for example: adjacent to) the first light-emitting unit 36a. For example, projections of the first light-emitting unit 36a and the second light-emitting unit 36b on the driving substrate 32 are strip-shaped. The electrodes are preferably disposed on both ends of the corresponding strip-shaped light-emitting units. In other embodiment, projections of the first light-emitting unit 36a and the second light-emitting unit 36b on the driving substrate 32 may have other polygonal shapes, for example, a square shape, a circular shape, an elliptical shape, a rhombic shape or other suitable shape. For example, if the projection of the first light-emitting unit 36a on the driving substrate 32 has a circular shape, the first side of the first light-emitting unit 36a refers to a right side (near the first electrode B 36aN), and a second side opposite the first side of the first light-emitting unit 36a refers to a left side (near the first electrode A 36aP). In addition, the first light-emitting unit 36a and the second light-emitting unit 36b prefer disposed substantially in parallel or slightly misaligned (or namely staggered), however, this embodiment is not limited thereto. In a preferred embodiment, the first electrode B 36aN and the second electrode B 36bN are coplanar and in the same direction (that is, the first electrode B 36aN and the second electrode B 36bN share one line 40a), and the first electrode B 36aN and the second electrode B 36bN are both located between the first electrode A 36aP and the second electrode A 36bP (inner sides). The first electrode A 36aP and the second electrode A 36bP are located on sides (outer sides) of the first electrode B 36aN and the second electrode B 36bN respectively.

As shown in FIG. 3, the first electrode A 36aP of the first light-emitting unit 36a is connected to a first electrode line A 38a, and the second electrode A 36bP of the second light-emitting unit 36b is connected to a second electrode line A 38b. The second electrode line A 38b and the first electrode line A 38a are independent in terms of signal, that is, the two receive signals from different sources separately and respectively. In a preferred embodiment, the first light-emitting unit 36a and the second light-emitting unit 36b are disposed on a same plane and are located in the same direction. In addition, a first electrode line B 40a is arranged between the first light-emitting unit 36a and the second light-emitting unit 36b and is connected to the first electrode B 36aN and the second electrode B 36bN respectively. Therefore, as can be seen from FIG. 3, in this embodiment, preferably, a disposition of the first electrode A 36aP and the first electrode B 36aN and a disposition of the second electrode A 36bP and the second electrode B 36bN substantially have a distribution in mirror symmetry with the first electrode line B 40a as a central axis, and a projection of the first electrode line B 40a on the driving substrate 32 preferably has a rectangular shape, however, the present disclosure is not limited thereto. In another embodiment, the shape of the projection of the first electrode line B 40a on the driving substrate 32 includes a curved shape, a bent shape, an H form, an I form, an O shape, an elliptical shape or other polygonal shape, but it is not limited to.

In view of a first embodiment, preferably, electrodes of light-emitting units inside two adjacent subpixel areas are substantially arranged in a mirroring manner, electrodes having a same polarity (for example, N type electrodes) of the light-emitting units are adjacent and are connected by using an electrode line having a same polarity (for example, an N type electrode line). Therefore, an arrangement quantity of electrode lines can be effectively reduced, and an area utilization rate of a touch display area (or referred to as an activated area (AA)) can be further increased. As compared with the design layout in FIG. 2, for the present embodiment, as shown in FIG. 3, an arrangement quantity of electrode lines can be effectively reduced, and flexibility of space distribution inside an equal area is further increased, thereby increasing an area utilization rate (for example, high PPI). In addition, because an arrangement quantity of electrode lines can be greatly reduced, a large usable space can be manufactured in an original design, which allows for possibilities of various different applications.

Figure 4:
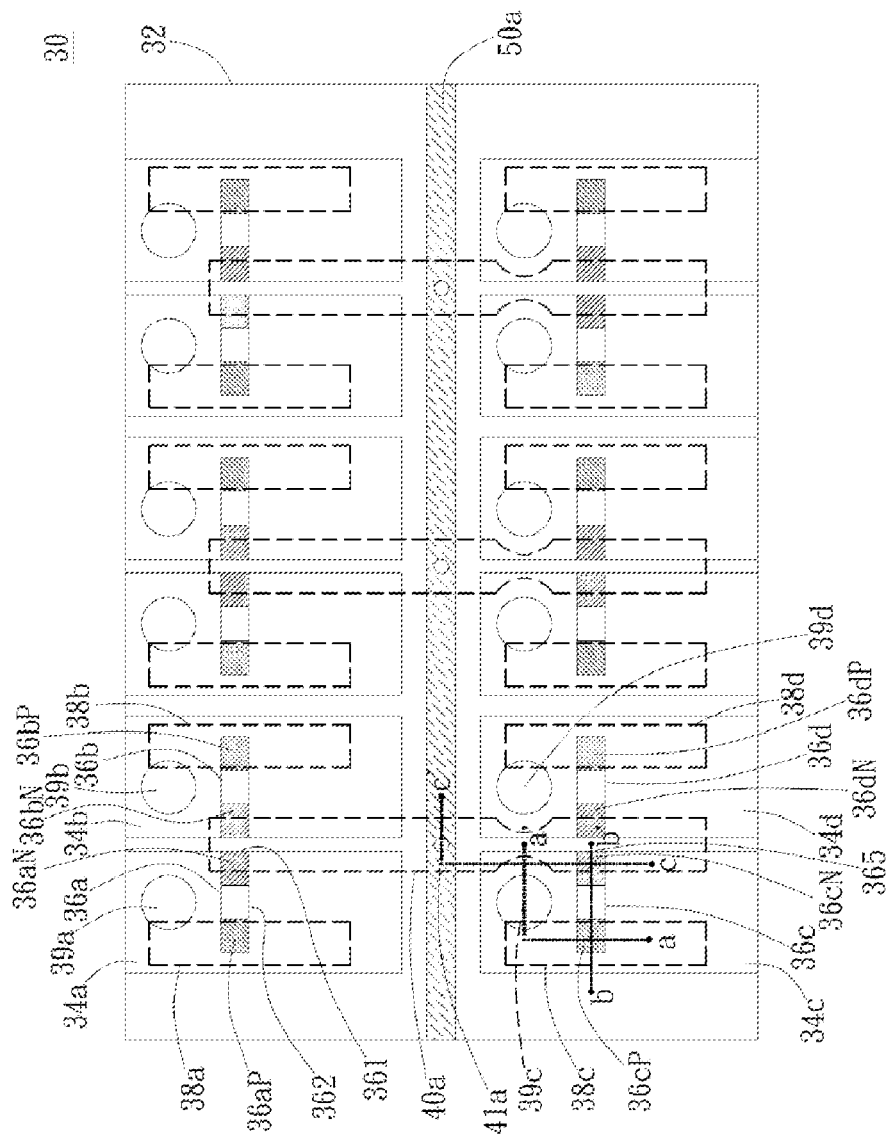
FIG. 4 is a partial schematic diagram of arrangement of elements of a display panel according to a second preferred embodiment of the present disclosure.

Referring to FIG. 4, FIG. 4 is a partial schematic diagram of arrangement of elements of a display panel according to a second preferred embodiment of the present disclosure. As shown in FIG. 4, a display panel 30 of the present disclosure includes a driving substrate 32. A driving circuit (not shown) is disposed on the driving substrate 32, that is, the driving circuit is disposed on a substrate (not represented), and a plurality of subpixel areas 34a to 34n arranged in an array manner is disposed on a surface of the driving circuit. The display panel 30 is preferably a self-emission display, but is not limited to. In an embodiment, the subpixel areas 34a, 34b, 34c, and 34d may form a pixel area. In another embodiment, according to a design of the display panel, two subpixel areas, three subpixel areas or more subpixel areas may also form one pixel area. In each subpixel area 34a to 34n, at least one light-emitting unit 36a to 36n is disposed respectively, that is, there may be one or more light-emitting units. The light-emitting unit 36a to 36n is preferably an LED, and for a type of the LED, reference may be made to the content described above. Each light-emitting unit 36a to 36n includes an electrode A and an electrode B located at both ends (or namely two ends) of the light-emitting unit 36a to 36n respectively. In this embodiment, the electrode A refers to a P type electrode, and the electrode B refers to an N type electrode; however, the present disclosure is not limited thereto. In another embodiment, the electrode A may also be an N type electrode, and the electrode B may also be a P type electrode, however, when the electrode A is already limited to a polarity, another electrode should not be arbitrarily changed with the other polarity.

To make the present disclosure more comprehensible, an example of two transversely adjacent subpixel areas 34a and 34b is used below for description. A first light-emitting unit 36a is disposed in the subpixel area 34a. The first light-emitting unit 36a includes a first electrode A 36aP and a first electrode B 36aN located at both ends (or namely two ends) of the first light-emitting unit 36a respectively. The first light-emitting unit 36a has a first end and a second end opposite the first end, the first electrode A 36aP is disposed at the first end, and the first electrode B 36aN is disposed at the second end. The first electrode A 36aP is connected to a first electrode line A 38a and can be connected to the driving circuit (not shown) by using a via 39a.

A second light-emitting unit 36b includes a second electrode A 36bP and a second electrode B 36bN located at both ends (or namely two ends) of the second light-emitting unit 36b respectively and located on a first side 361 of the first light-emitting unit 36a. In this embodiment, the first side 361 refers to a side near the first electrode B 36aN of the first light-emitting unit 36a. The first electrode A 36aP is located at an end of the first light-emitting unit 36a, and the end of the first light-emitting unit 36a is away from the second light-emitting unit 36b. The first electrode B 36aN is located at another end of the first light-emitting unit 36a, and the another end of the first light-emitting unit 36a is toward to (or namely adjacent to) the second light-emitting unit 36b. The second electrode A 36bP is located at an end of the second light-emitting unit 36b, and the end of the second light-emitting unit 36b is away from the first light-emitting unit 36a. The second electrode B 36bN is located at another end of the second light-emitting unit 36b, and the another end of the second light-emitting unit 36b is toward to (or namely adjacent to) the first light-emitting unit 36a. Projections of the first light-emitting unit 36a and the second light-emitting unit 36b on the driving substrate 32 both preferably have a strip-shaped, and are preferably disposed in substantially parallel. In addition, the electrodes are preferably disposed on both ends (or namely two ends) of a light-emitting unit having a strip-shaped. In another embodiment, for the shapes of the first light-emitting unit 36a and the second light-emitting unit 36b, reference may as the foregoing description. In a preferred embodiment, the first electrode B 36aN and the second electrode B 36bN are coplanar and colinear (for example, the colinear means the first electrode B 36aN and the second electrode B 36bN share one line 40a), and the first electrode B 36aN and the second electrode B 36bN are both located between the first electrode A 36aP and the second electrode A 36bP (inner sides). The first electrode A 36aP and the second electrode A 36bP are located on sides (outer sides) of the first electrode B 36aN and the second electrode B 36bN respectively.

As shown in FIG. 4, the second electrode A 36bP of the second light-emitting unit 36b is connected to a second electrode line A 38b, and can be connected to the driving circuit (not shown) by using a via 39b, however, positions of vias 39a, 39b, 39c, and 39d are shown in FIG. 4 only schematically. The second electrode line A 38b and the first electrode line A 38a are independent in terms of signal. In a preferred embodiment, the first light-emitting unit 36a and the second light-emitting unit 36b are disposed coplanar and are located in a same direction. In addition, a first electrode line B 40a is arranged between the first light-emitting unit 36a and the second light-emitting unit 36b, and is connected to the first electrode B 36aN and the second electrode B 36bN respectively. Therefore, as can be seen from FIG. 4, in this embodiment, a disposition of the first electrode A 36aP and the first electrode B 36aN and a disposition of the second electrode A 36bP and the second electrode B 36bN substantially have a distribution in mirror symmetry with the first electrode line B 40a as a central axis, and a projection of the first electrode line B 40a on the substrate 32 preferably has a rectangular shape; however, the present disclosure is not limited thereto. In another embodiment, the shape of the projection of the first electrode line B 40a on the substrate 32 may be a curved shape, a bent shape, an H form, an I form, an O shape, an elliptical shape or other polygonal shapes.

Because in the present disclosure, electrodes of light-emitting units inside two adjacent subpixel areas are substantially arranged in a mirroring manner, electrodes having a same polarity (for example, N type electrodes) of the light-emitting units are adjacent and are connected by using the same electrode line (for example, an N type electrode line). Therefore, an arrangement quantity of electrode lines can be effectively reduced, and an area utilization rate of a touch display area (or referred to as AA) can be further increased. As compared with the design layout in FIG. 2, for the present disclosure, as shown in FIG. 4, more subpixel areas can be placed within the same area, and therefore, the resolution (for example, high PPI) can be effectively improved. In addition, because an arrangement quantity of electrode lines can be greatly reduced, a large usable space can be manufactured in an original design, which allows for possibilities of various different applications.

In this embodiment, the display panel 30 of the present disclosure further includes a third light-emitting unit 36c and a fourth light-emitting unit 36d. The third light-emitting unit 36c is disposed in the subpixel area 34c, and the fourth light-emitting unit 36d is disposed in the subpixel area 34d. The third light-emitting unit 36c is located at a second side 362 of the first light-emitting unit 36a, the second side 362 interlaced with (for example, perpendicular to) the first side 361, and the third light-emitting unit 36c includes a third electrode A 36cP and a third electrode B 36cN located at both ends (or namely two ends) of the third light-emitting unit 36c respectively. The third light-emitting unit 36c has a first end and a second end opposite the first end, the third electrode A 36cP is disposed at the first end, and the third electrode B 36cN is disposed at the second end. The third electrode A 36cP is connected to a third electrode line A 38c, and may be connected to the driving circuit by using the via 39c. The fourth light-emitting unit 36d is located on a first side 365 of the third light-emitting unit 36c and is adjacent to the second light-emitting unit 36b. In this embodiment, the first side 365 refers to a side (for example, an outer side) near the third electrode B 36cN of the third light-emitting unit 36c. That is, the first side 361 and the first side 365 are on the same side, and are interlaced with (for example, perpendicular to) the second side 362 respectively. The fourth light-emitting unit 36d includes a fourth electrode A 36dP and a fourth electrode B 36dN located at both ends (or namely two ends) of the fourth light-emitting unit 36d respectively, and the fourth electrode A 36dP is connected to a fourth electrode line A 38d and be connected to the driving circuit by using the via 39d. The fourth electrode line A 38d and the third electrode line A 38c are separated from each other and are independent in terms of signal, and the two receive signals from different sources respectively.

In an embodiment, the first electrode line B 40a extends from between the first light-emitting unit 36a and the second light-emitting unit 36b to between the third light-emitting unit 36c and the fourth light-emitting unit 36d. The third electrode B 36cN is located at another end of the third light-emitting unit 36c, and the another end of the third light-emitting unit 36c is toward to (or namely adjacent to) the fourth light-emitting unit 36d as compared with the third electrode A 36cP. The fourth electrode B 36dN is located at another end of the fourth light-emitting unit 36d, and the another end of the fourth light-emitting unit 36d is toward to (or namely adjacent to) the third light-emitting unit 36c as compared with the fourth electrode A 36dP. The first electrode line B 40a is connected to the third electrode B 36cN and the fourth electrode B 36dN respectively. In other words, the first electrode line B 40a extends between the first light-emitting unit 36a and the second light-emitting unit 36b and between the third light-emitting unit 36c and the fourth light-emitting unit 36d, and is substantially parallel to the first sides 361 and 365. As shown in FIG. 4, the third electrode B 36cN and the fourth electrode B 36dN are coplanar and colinear (for example, colinear means the third electrode B 36cN and the fourth electrode B 36dN share one line 40a). The third electrode B 36cN and the fourth electrode B 36dN are both located between the third electrode A 36cP and the fourth electrode A 36dP (for example, inner sides), and the third electrode A 36cP and the fourth electrode A 36dP are located on sides (for example, outer sides) of the third electrode B 36cN and the fourth electrode B 36dN respectively.

In a preferred embodiment, the first electrode B 36aN of the first light-emitting unit 36a, the second electrode B 36bN of the second light-emitting unit 36b, the third electrode B 36cN of the third light-emitting unit 36c, and the fourth electrode B 36dN of the fourth light-emitting unit 36d may all be connected to the driving circuit through the same first electrode line B 40a and by using a via 41a. In addition, the display panel 30 of the present disclosure further includes a connecting line 50a extending between the first light-emitting unit 36a and the third light-emitting unit 36c and between the second light-emitting unit 36b and the fourth light-emitting unit 36d. The first electrode line B 40a crosses over the connecting line 50a and is connected to the connecting line 50a by using the via 41a to be connected to the driving circuit. That is, the connecting line 50a and the first electrode line B 40a are interlaced (for example, perpendicular), and the connecting line 50a and the second side 362 are substantially parallel. The connecting line 50a may be connected to different first electrode lines B 40a respectively, to provide different light-emitting units with the required signals for electrodes B, for example, a common voltage signal.

Figure 5:
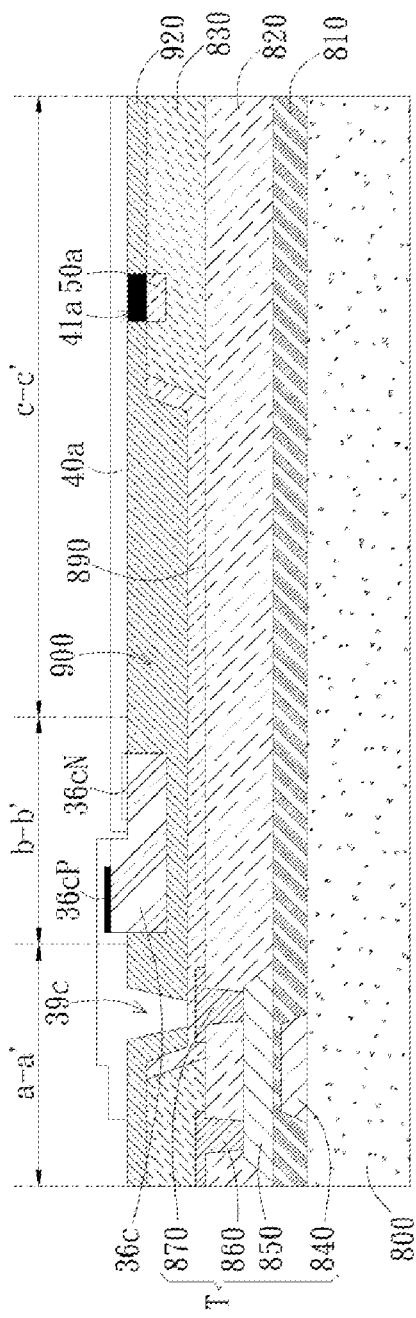
FIG. 5 is a partial sectional diagram of FIG. 4.

Referring to FIG. 5, FIG. 5 is a partial sectional diagram of FIG. 4. A sectional diagram along a direction a-a' in FIG. 4 corresponds to the position a-a' shown in FIG. 5, a sectional diagram along a direction b-b' in FIG. 4 corresponds to the position of b-b' shown in FIG. 5, and a sectional diagram along a direction of c-c' in FIG. 4 corresponds to the position of c-c' shown in FIG. 5.

As shown in FIG. 5, FIG. 5 is a schematic sectional diagram of a connection of a driving circuit T and the third light-emitting unit 36c. For example, the driving circuit T has a gate electrode layer 840 disposed on a substrate 800. A first insulation layer 810 covers the gate electrode layer 840. A semiconductor layer 850 is disposed on the first insulation layer 810. A second insulation layer 820 covers the semiconductor layer 850, the second insulation layer 820 has openings (not marked), and a source electrode 860 and a drain electrode 870 are filled in the openings (not marked). The subpixel area 34c of the present disclosure may selectively include a pixel define layer 830 and have a receiving space 900. A conductive layer (or namely a pixel electrode layer) 890 is disposed on the second insulation layer 820 and inside the receiving space 900, and the conductive layer 890 can be cover a side wall of the pixel define layer 830 and the bottom of the receiving space 900 (or namely on part of the second insulation layer 820). The conductive layer 890 is electrically connected to the drain electrode 870. The third light-emitting unit 36c is disposed above the conductive layer 890, and is fixed inside the receiving space 900 by using an adhesion layer 920. The third light-emitting unit 36c has the third electrode A 36cP and the third electrode B 36cN, and the electrodes 36cP-36cN are located on a first surface (or namely an upper surface) of the third light-emitting unit 36c. A second surface (or namely a lower surface) of the third light-emitting unit 36c is in contact with the adhesion layer 920, and the first surface (or namely the upper surface) and the second surface (or namely the lower surface) are opposite surfaces of the third light-emitting unit 36c respectively. The third electrode A 36cP is electrically connected to the drain electrode 870 by using the third electrode line A 38c through the via 39c. The third electrode B 36cN is electrically connected to the connecting line 50a by using the first electrode line B 40a through the via 41a.

Figure 6:
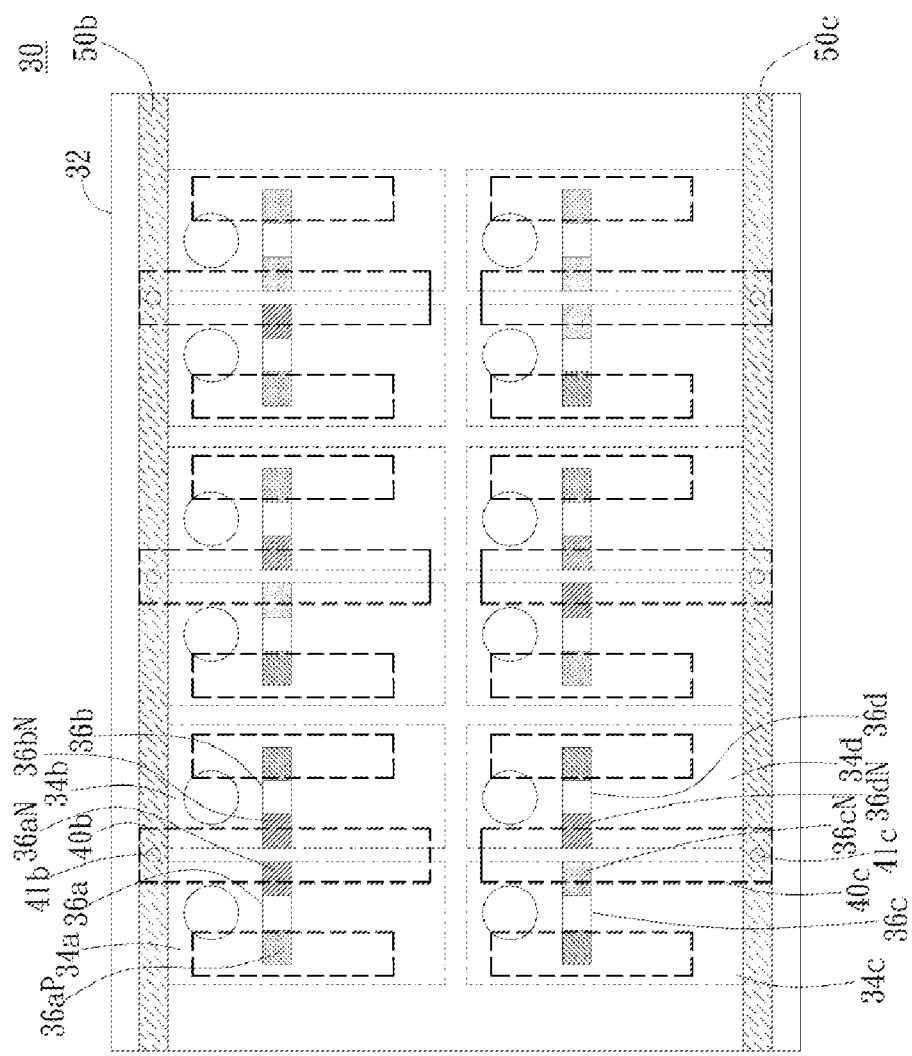
FIG. 6 is a partial schematic diagram of arrangement of elements of a display panel according to another preferred embodiment of the present disclosure.

Referring to FIG. 6, FIG. 6 is a partial schematic diagram of arrangement of elements of a display panel according to another preferred embodiment of the present disclosure. A difference between the preferred embodiment is that a second electrode line B 40b and a third electrode line B 40c used in place of the first electrode line B 40a. In addition, a first connecting line 50b and a second connecting line 50c are used to replace only one connecting line 50a.

Further, the second electrode line B 40b and the third electrode line B 40c are independent and separated, where the second electrode line B 40b is arranged between a first light-emitting unit 36a and a second light-emitting unit 36b, and is connected to a first electrode B 36aN and a second electrode B 36bN respectively. The third electrode line B 40c is arranged between a third light-emitting unit 36c and a fourth light-emitting unit 36d, and is connected to a third electrode B 36cN and a fourth electrode B 36dN respectively. The first connecting line 50b is arranged on a side of subpixel areas 34a and 34b (for example, an outer side), and the side of subpixel areas 34a and 34b is away from subpixel areas 34c and 34d. The second connecting line 50c is arranged on a side of the subpixel areas 34c and 34d (for example, an outer side), and the side of the subpixel areas 34c and 34d is away from the subpixel area 34a and 34b, In addition, the second electrode line B 40b crosses over the first connecting line 50b is connected to the first connecting line 50b, and the third electrode line B 40c crosses over the second connecting line 50c and is connected to the second connecting line 50c. In other words, the second electrode line B 40b and the first connecting line 50b are interlaced (for example, perpendicular), the third electrode line B 40c and the second connecting line 50c are interlaced (for example, perpendicular), and the second electrode line B 40b and the third electrode line B 40c are substantially parallel.

In an embodiment, the first electrode B 36aN of the first light-emitting unit 36a and the second electrode B 36bN of the second light-emitting unit 36b may be connected to a driving circuit through the second electrode line B 40b and by using a via 41b and the first connecting line 50b, and the third electrode B 36*c*N of the third light-emitting unit 36*c* and the fourth electrode B 36*d*N of the fourth light-emitting unit 36*d* may be connected to the driving circuit by using the third electrode line B 40*c* and by using a via 41*c* and the second connecting line 50*c*. With this design, different signals can be transferred to the second electrode line B 40*b*, the third electrode line B 40*c* and their connected light-emitting units respectively by using the first connecting line 50*b* and the second connecting line 50*c*, achieving an objective of signal isolation.

Figure 7:
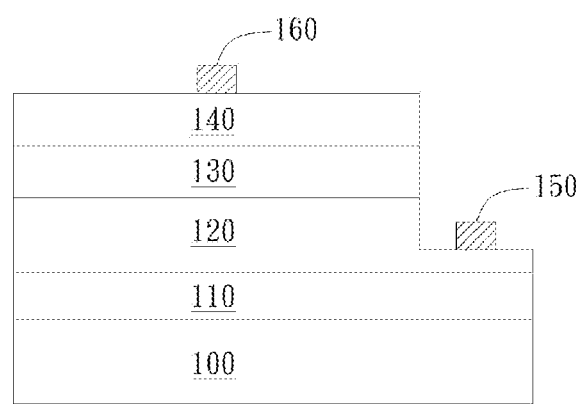
FIG. 7 is a partial sectional diagram of a light-emitting unit according to the present disclosure.

Referring to FIG. 7, FIG. 7 is a partial sectional diagram of a light-emitting unit according to the present disclosure. A first light-emitting unit 36*a* is used as an example. The first light-emitting unit 36*a* includes a substrate 100 respectively. The substrate 100 may be sapphire, a semiconductor, silicon carbon or other suitable material, or a combination of at least two of the above-mentioned materials. For example, in the present disclosure, a sapphire substrate is used a prefer example. A buffer layer 110 is disposed on the substrate 100, and a preferable material of the buffer layer 110 is aluminum nitride (AlN). A first type semiconductor layer 120 is disposed on the buffer layer 110, and a material of the first-type semiconductor layer 120 is, for example, N-type nitride gallium (N-GaN), N-type perovskite, or other suitable material or a combination thereof. A second type semiconductor layer 140 is disposed on the first type semiconductor layer 120, and the second type semiconductor layer 140 is, for example, P-type nitride gallium (P-GaN), P-type perovskite, or other suitable material or a combination thereof. An active layer 130 is disposed between the first type semiconductor layer 120 and the second type semiconductor layer 140, for example, the active layer 130 is disposed on the first-type semiconductor layer 120, and the active layer 130 is preferably multiple quantum well (MQW) structure or single quantum well (SQW). A first type electrode 150 is disposed on the first type semiconductor layer 120, and a second type electrode 160 is disposed on the second type semiconductor layer 140. Materials of the first type electrode 150 and the second type electrode 160 include copper (Cu), but it is not limited to. In an embodiment, the first type refers to an N type, and the second type refers to a P type, that is, the two types have different polarities. In another embodiment, the first type refers to a P type, and the second type refers to an N type, that is, the two types have different polarities. In other words, a first electrode A 36*a*P of the first light-emitting unit 36*a* and a second electrode A 36*b*P of a second light-emitting unit 36*b* are used as the second type electrode 160 respectively, and are disposed respectively on the second type semiconductor layers 140 of the corresponding light-emitting units. A first electrode B 36*a*N of the first light-emitting unit 36*a* and a second electrode B 36*b*N of the second light-emitting unit 36*b* are used as the first type electrode 150 respectively, and are disposed respectively on the first-type semiconductor layers 120 of the corresponding light-emitting units.

Figure 8A:
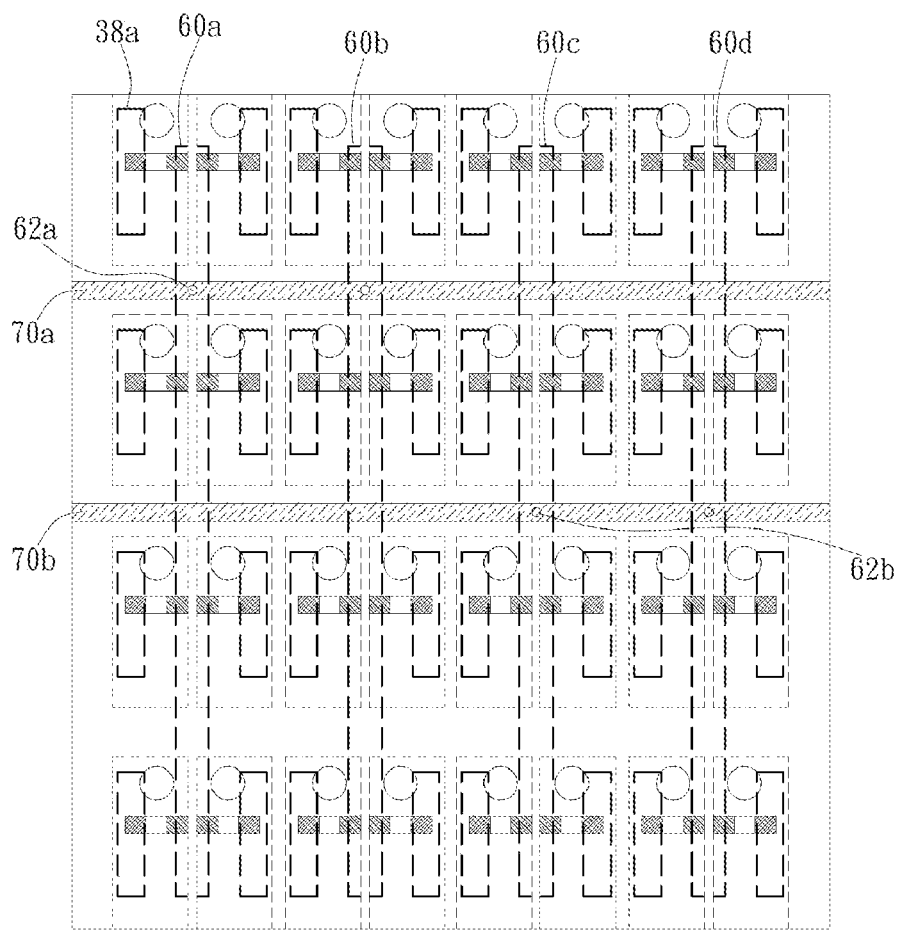
FIG. 8A is a partial schematic diagram of a design in which a display panel is applied to a self capacitance touch control module according to the present disclosure.

Referring to FIG. 8A, FIG. 8A is a partial schematic diagram of a design in which a display panel is applied to a self capacitance touch control module. A design structure in FIG. 8A is equivalent to an extension layout of subpixel areas 34*a* to 34*d*, that is, a plurality of subpixel areas 34*a* to 34*d* arranged in an array manner in FIG. 4. Therefore, a layout and positions of related elements are no longer elaborated.

As shown in FIG. 8A, a first electrode line B 60*a* and a second electrode line B 60*b* cross over a first connecting line 70*a* and are connected to the first connecting line 70*a* by using a through hole 62*a*. A third electrode line B 60*c* and a fourth electrode line B 60*d* cross over a second connecting line 70*b* and are connected to the second connecting line 70*b* by using a through hole 62*b*. The first electrode line B 60*a* and the second electrode line B 60*b* are used as one sensing electrode of self capacitance touch control and the third electrode line B 60*c* and the fourth electrode line B 60*d* are used as another sensing electrode of self capacitance touch control. The sensing electrodes receive driving signals by using the first connecting line 70*a* and the second connecting line 70*b* respectively. When a touch action is sensed (that is, capacitance of the first connecting line 70*a* changes), the first connecting line 70*a* and the second connecting line 70*b* receive sensing signals and send the sensing signals to a logic circuit for calculation (not shown) respectively, and then determine positions of the received sensing signals. In addition, a quantity of connections between an electrode line and the first connecting line 70*a* and a quantity of connections between an electrode line and the second connecting line 70*b* are determined according to a design requirement of self capacitance touch control.

In this embodiment, electrode lines A and electrode lines B of all light-emitting units may be preferable arranged on the same layer, and may have a horizontal relationship, however, the present disclosure is not limited thereto. In addition, the electrode line A connected to the electrode A of each light-emitting unit, for example, the first electrode line A 38*a* connected to the first electrode A 36*a*P of the first light-emitting unit 36*a*, and the first electrode line A 38*a* is applied an anode voltage to control the light-emitting unit as an example. The connecting line connected to the electrode B of each light-emitting unit, for example, the first connecting line 70*a* is applied a cathode voltage to control the light-emitting unit as an example. Moreover, light-emitting brightness of the light-emitting unit 36*a* is controlled by using a voltage difference between the anode (for example, the electrode A) voltage and the cathode (for example, the electrode B) voltage. In a preferred embodiment, the connecting line, for example, the first connecting line 70*a* is selectively enabled to perform transfer of a control signal and an image control pulse signal respectively at intervals in a manner of a different time. A relative relationship between the signals is described below by using an example.

Figure 8B:
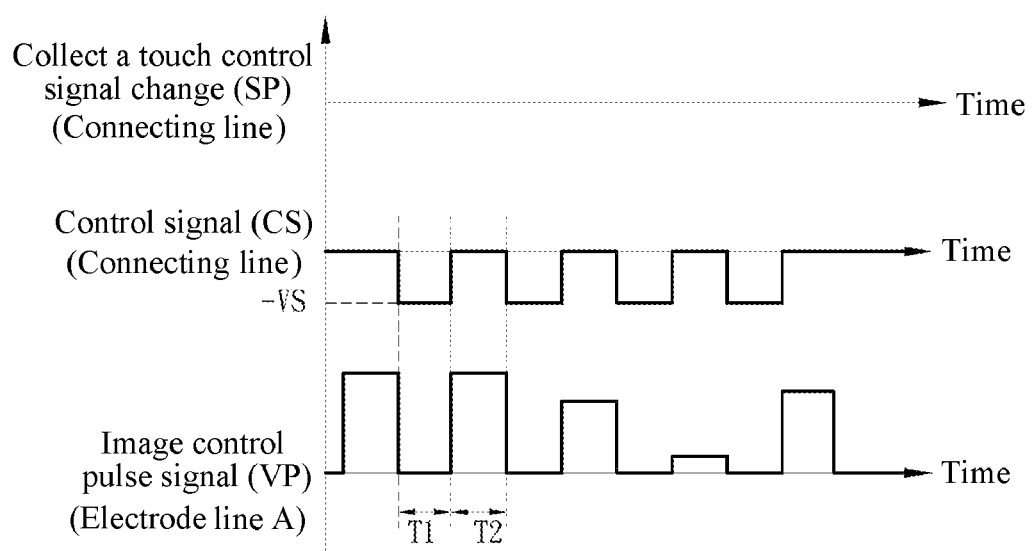
FIG. 8B is an exemplary diagram of timing waveform in the driving display method corresponding to FIG. 8A.

Referring to both FIG. 8A and FIG. 8B, FIG. 8B is an exemplary diagram of potential timing in the driving display method corresponding to FIG. 8A. For example, the first electrode line B 60*a* receives a control signal CS of an external circuit from a correspondingly connected first connecting line 70*a*. The control signal CS and an image control pulse signal VP are obtained by combining a common voltage pulse signal and a sensing scanning pulse signal that have the time difference (that is, a signal waveform changes over time). That is, the control signal CS may simultaneously control a grayscale and control a touch control signal. In addition, the first electrode line B 60*a* may collect a touch control signal change SP at the first connecting line 70*a* and generate a touch control sensing result from a capacitance change of the first connecting line 70*a*. After calculation by the logic circuit, a touch position may be determined. Therefore, in a display stage, the first connecting line 70*a* may be used to transfer the potential of the first electrode line B 60*a*, and in a touch control stage, the first connecting line 70*a* may be used to transfer a sensing scanning pulse signal. That is, the first connecting line 70*a* has the foregoing two functions of collecting the touch control signal change SP and receiving the control signal CS.

Figure 9:
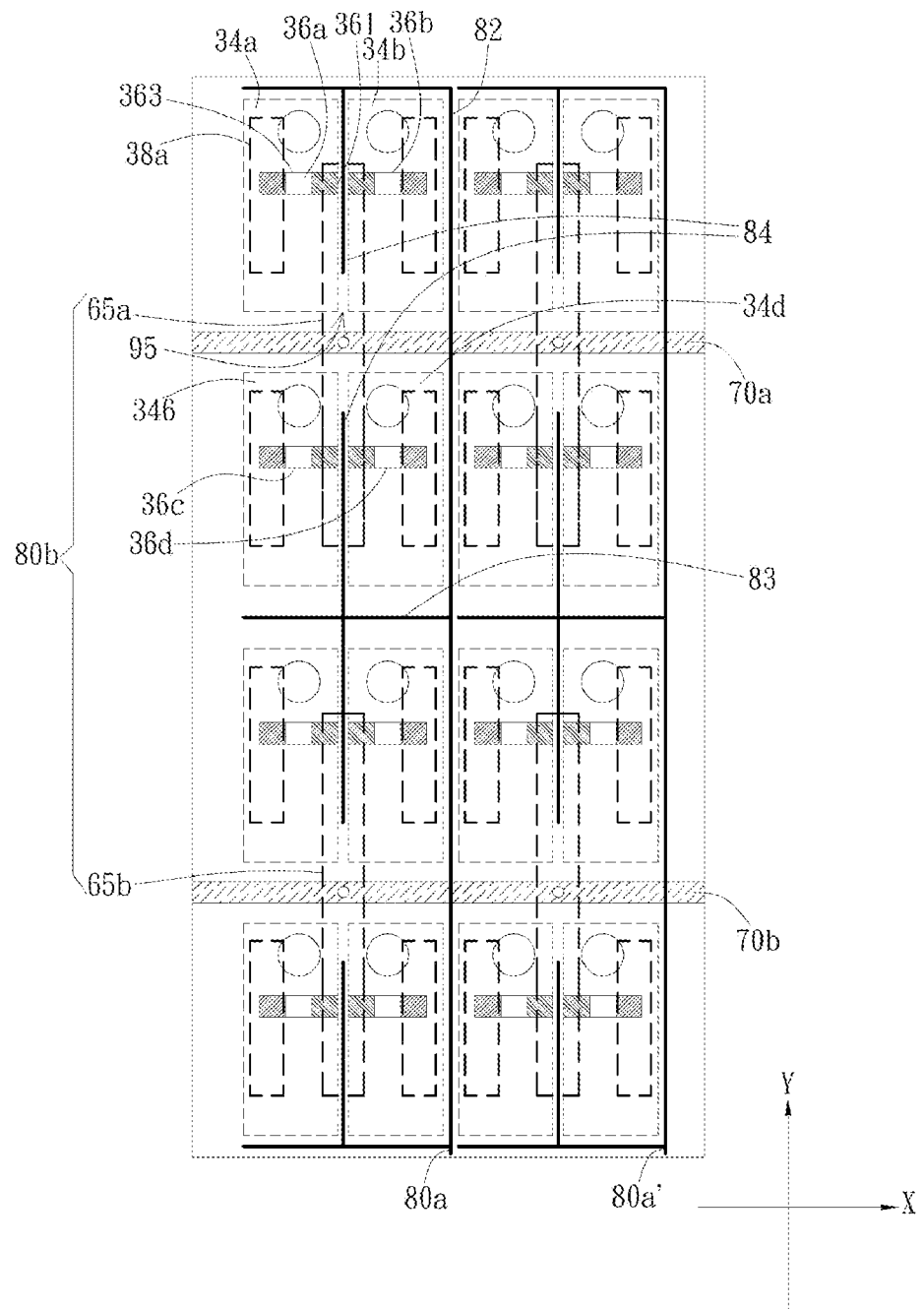
FIG. 9 is a partial schematic diagram of a design in which a display panel is applied to a mutual capacitance touch control module according to the present disclosure.

Referring to FIG. 9, FIG. 9 is a partial schematic diagram of a design in which a display panel is applied to a mutual capacitance touch control module according to the present disclosure. A design structure in FIG. 9 is similar to that in FIG. 8, and a major difference between the two lies in that in FIG. 9, a plurality of direction touch control electrodes is further included. Because when the design of the present disclosure is used, a larger space may be provided for wiring, the direction touch control electrodes can be added without affecting a quantity and a pixel aperture ratio of pixels.

As shown in FIG. 9, first touch control electrodes 80a are used as an example. The first touch control electrodes 80a extend and are distributed in a first direction Y and a second direction X to respective at least one side of a first light-emitting unit 36a, a second light-emitting unit 36b, a third light-emitting unit 36c, and a fourth light-emitting unit 36d. In other words, any one of the first light-emitting unit 36a, the second light-emitting unit 36b, the third light-emitting unit 36c, and the fourth light-emitting unit 36d has one side adjacent to the first touch control electrode 80a along the first direction Y. In addition, a first electrode line B 65a and a second electrode line B 65b receive driving signals by using the first connecting line 70a and the second connecting line 70b respectively. The first electrode line B 65a and the second electrode line B 65b respectively form second touch control electrodes 80b that match the first touch control electrodes 80a, generate touch control sensing capacitance change results of the first touch control electrode 80a and the second touch control electrode 80b, and transfer touch control sensing results by using the first touch control electrode 80a or the second touch control electrode 80b respectively.

For example, the first connecting line 70a and the second connecting line 70b may have independent row signals or a series of potential signals, and may match the first touch control electrodes 80a according to a case. Further, if the first touch control electrode 80a and a third touch control electrode 80a' have independent column signals, the first connecting line 70a and the second connecting line 70b may have independent row signals. Therefore, the first light-emitting unit 36a, the second light-emitting unit 36b, the third light-emitting unit 36c, and the fourth light-emitting unit 36d can be form a smallest touch control unit. In another aspect, if the first touch control electrode 80a and the third touch control electrode 80a' are a series of equipotential signals, the first connecting line 70a and the second connecting line 70b may be a series of equipotential signals. Therefore, 16 light-emitting units shown in FIG. 9 may be form a smallest touch control unit.

In this embodiment, the first electrode line B 65a between the first light-emitting unit 36a and the second light-emitting unit 36b, and the first electrode line B 65a has at least one slit 95 extending along a first side 361 of the first light-emitting unit 36a. For example, the first touch control electrode 80a includes a main line 82, a side line 83 extending along the second direction X, and a branch line 84 extending along the first direction Y. The main line 82 extends along the first side 361 of the first light-emitting unit 36a substantially perpendicular to a third side 363, for example, the main line 82 is substantially parallel to the first side 361. The side line 83 is connected to the main line 82, and is connected to (for example, substantial perpendicularly connected to) the main line 82. The branch line 84 is substantially parallel to the main line 82 and the branch line 84 is connected with the side line 83, and the branch line 84 is branched from the side line 83 and enters the slit 95. That is, the branch line 84 and a corresponding electrode line (for example, the first electrode line B 65a) are separated from each other, and the branch line 84 extends into the corresponding electrode line (for example, the first electrode line B 65a). A vertical projection of the branch line 84 on the substrate has a shape similar to an H form, a vertically-connected-double-U shape, or another appropriate shape. By means of such a design, an arrangement density of the first touch control electrode 80a may be increased, and precision and sensitivity of touch control sensing are increased. In addition, in this embodiment, an electrode line A and electrode line B of all light-emitting units may be preferably arranged on a same layer; however, the present disclosure is not limited thereto. In addition, a connecting line and the direction touch control electrodes may be preferably arranged on different layers, that is, have a vertical relationship; however, the present disclosure is not limited thereto.

In this embodiment, for an electrode line A connected to an electrode A of each light-emitting unit, for example, a first electrode line A 38a connected to a first electrode A 36aP of the first light-emitting unit 36a, an anode voltage that is defined to be used to control the light-emitting unit is used as an example. For a connecting line connected to an electrode B of each light-emitting unit, for example, the first connecting line 70a, a cathode voltage that is defined to be used to control the light-emitting unit is used as an example, and may collect a sensing signal formed from a capacitance difference change. The direction touch control electrodes, for example, the first touch control electrodes 80a are defined to be used to collect a capacitance difference change. In a preferred embodiment, the connecting line, for example, the first connecting line 70a, is selectively enabled to output a control signal, and receive and send a touch control signal change respectively at intervals in a manner of a time difference at different time.

Figure 10A:
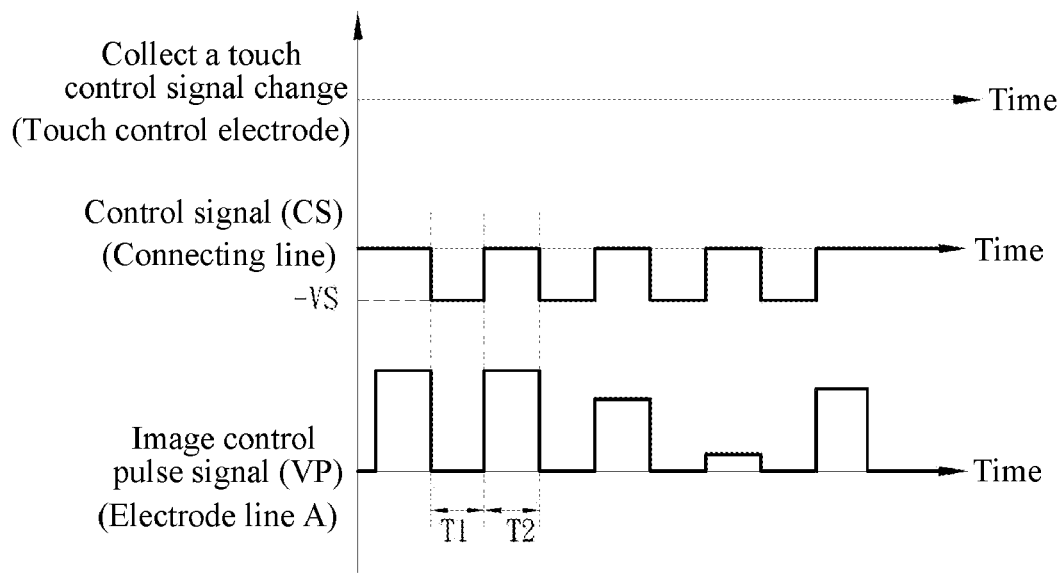
FIG. 10A is an exemplary diagram of timing waveform in the driving display method corresponding to FIG. 9.

Referring to both FIG. 9 and FIG. 10A, FIG. 10A is an exemplary diagram of potential timing in the driving display method corresponding to FIG. 9. For example, an electrode line B (for example, the first electrode line B 65a) receives a control signal CS of an external circuit from a correspondingly connected connecting line (for example, the first connecting line 70a). The control signal CS is obtained by combining a common voltage pulse signal and a sensing scanning pulse signal that have a time difference (that is, a signal waveform changes over time). As shown in FIG. 10A, the electrode line A (for example, the first electrode line A 38a) receives an image control pulse signal VP, and the image control pulse signal VP corresponds to the timing of a common voltage pulse signal.

For example, when the sensing scanning pulse signal SP does not have a scanning potential −VS (which may be, for example, a sensing scanning pulse signal during a time interval T2), a driving circuit (not shown) as above-mentioned outputs a driving signal to enable the electrode line A (for example, the first electrode line A 38a) to have a first operation potential, and further enable an LED (for example, the first light-emitting unit 36a) to generate light-emitting brightness corresponding to the first operation potential. When the sensing scanning pulse signal has a scanning potential −VS (which may be, for example, a sensing scanning pulse signal during a time interval T1), the driving circuit as above-mentioned does not output a driving signal, to enable the electrode line A (for example, the first electrode line A 38a) to approximately have a zero potential. In this case, the LED (for example, the first light-emitting unit 36a) does not emit light abnormally.

In other words, the electrode line A avoids a scanning pulse of the sensing scanning pulse signal received by the connecting line, and uses a lagging or leading pulse voltage to control a voltage difference between the connecting line and the electrode line B to control a grayscale. In this case, the connecting line 70a or 70b is used to transfer the sensing scanning pulse signal, and the touch control electrode 80a or 80a' may still independently collect a capacitance change (corresponding to a common voltage pulse signal) caused by a finger touch. After computation by a logic circuit, a touch position may be determined. Therefore, in a display stage, the connecting line (for example, the first connecting line 70a) may be used to transfer the potential of the electrode B (for example, the first electrode line B 65a), and in a touch control stage, the touch control electrode (for example, the first touch control electrode 80a) may be used to transfer the sensing scanning pulse signal.

Figure 10B:
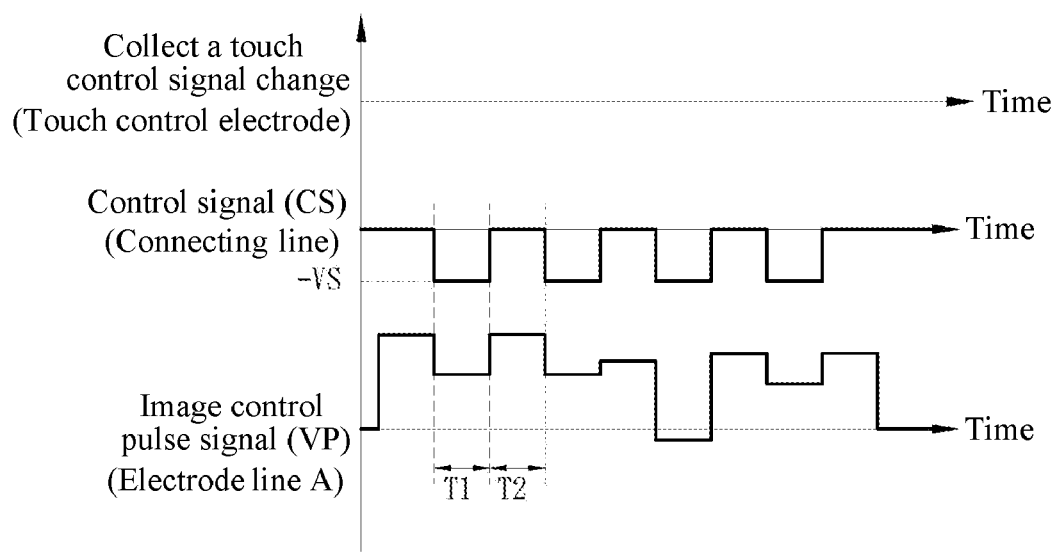
FIG. 10B is an exemplary diagram of timing waveform in the driving display method corresponding to FIG. 9.

Referring to both FIG. 9 and FIG. 10B, FIG. 10B is an exemplary diagram of potential timing in the driving display method corresponding to FIG. 9. As shown in FIG. 10B, the control signal CS is obtained by combining a common voltage pulse signal and a sensing scanning pulse signal that have a time difference (that is, a signal waveform changes over time). The electrode line A receives an image control pulse signal VP, and the image control pulse signal VP is obtained by combining an image control basis signal and a compensation pulse signal. The compensation pulse signal corresponds to timing of the sensing scanning pulse signal. Preferably, the image control basis signal in the image control pulse signal VP achieves different brightness at a given time relative to a voltage difference of the control signal CS to further adjust a grayscale. A voltage difference change occurs because the control signal CS includes the sensing scanning pulse signal, and therefore, the compensation pulse signal also needs to be added to the image control pulse signal VP, to compensate for the foregoing voltage difference change. In this case, the direction touch control electrode may still independently collect a capacitance change (corresponding to a common voltage pulse signal) caused by a finger touch. After computation by the logic circuit, a touch position may be determined.

For example, when the sensing scanning pulse signal does not have a scanning potential –VS (which may be, for example, the sensing scanning pulse signal during the time interval T2), the driving circuit (not shown) as above-mentioned outputs a driving signal to enable the electrode line A (for example, the first electrode line A 38a) to have a second operation potential, and to further enable the LED (for example, the first light-emitting unit 36a) to generate light-emitting brightness corresponding to the second operation potential. When the sensing scanning pulse signal has a scanning potential –VS (which may be, for example, the sensing scanning pulse signal during the time interval T1), the driving circuit as above-mentioned outputs a driving signal to enable the electrode line A (for example, the first electrode line A 38a) to have a third operation potential. The third operation potential is used to compensate for the scanning potential-VS, and further enable the LED (for example, the first light-emitting unit 36a) to generate light-emitting brightness corresponding to a potential difference (that is, the third operation potential minus the scanning potential-VS) between the electrode line A (for example, the first electrode line A 38a) and the connecting line (for example, the first connecting line 70a).

In conclusion, in the present disclosure, electrodes of light-emitting units in two adjacent subpixel areas are arranged in a mirroring manner, so that electrodes having a same polarity of the light-emitting units are adjacent and are connected by using a same electrode line. Therefore, an arrangement quantity of electrode lines can be effectively reduced, so that more subpixel areas can be placed within a same area, and the resolution of a display panel can be further improved.

The present disclosure has been described with reference to the foregoing related embodiments; however, the foregoing embodiments are merely examples of implementing the present disclosure. It should be noted that the disclosed embodiments are not intended to limit the scope of the present disclosure. On the contrary, modifications and equivalent settings that are included in the spirit and scope of the claims all fall within the scope of the present disclosure.

What is claimed is:

1. A display panel, comprising:
    a first light-emitting unit, comprising a first electrode A and a first electrode B located at both ends of the first light-emitting unit respectively;
    a first electrode line A, electrically connected to the first electrode A;
    a second light-emitting unit, comprising a second electrode A and a second electrode B located at both ends of the second light-emitting unit respectively, wherein the first electrode B is closer to the second light-emitting unit than the first electrode A is, and the second electrode B is closer to the first light-emitting unit than the second electrode A is;
    a third light-emitting unit, located on a second side of the first light-emitting unit, and the second side substantially perpendicular to the first side, and comprising a third electrode A and a third electrode B located at both ends of the third light-emitting unit respectively;
    a fourth light-emitting unit, located on a side of the third light-emitting unit, and connected to the second light-emitting unit, the fourth light-emitting unit comprising a fourth electrode A and a fourth electrode B located at both ends of the fourth light-emitting unit respectively, wherein the third electrode B is closer to the fourth light-emitting unit than the third electrode A is, and the fourth electrode B is closer to the third light-emitting unit than the fourth electrode A is;
    a first electrode line B, arranged between the first light-emitting unit and the second light-emitting unit, between the third light-emitting unit and the fourth light-emitting unit, extending from between the first light-emitting unit and the second light-emitting unit to between the third light-emitting unit and the fourth light-emitting unit, and connecting to the first electrode B, the second electrode B, the third electrode B, and the fourth electrode B respectively; and
    a connecting line extending between the first light-emitting unit and the third light-emitting unit and between the second light-emitting unit and the fourth light-emitting unit, wherein the first electrode line B crosses over the connecting line, and is electrically connected to the connecting line;
    wherein in a display stage, the connecting line controls grayscales of the first light-emitting unit, the second light-emitting unit, the third light-emitting unit, and the fourth light-emitting unit, and in a touch control stage, the connecting line as a first touch control electrode is adapted to generate touch sensing signal.

2. The display panel according to claim 1, wherein a disposition of the first electrode A and the first electrode B and a disposition of the second electrode A and the second electrode B are distributed in mirror symmetry with the first electrode line B as a central axis, and a disposition of the third electrode A and the third electrode B and a disposition of the fourth electrode A and the fourth electrode B are distributed in mirror symmetry with the first electrode line B as the central axis.

3. The display panel according to claim 1, further comprising:
a second touch control electrode, comprising:
a main line, substantially arranged parallel along the second light-emitting unit extending to the fourth light-emitting unit;
a side line, connected to the main line, and substantially perpendicular to the main line; and
a branch line, connected to the side line, and substantially parallel to the main line;
wherein the first touch control electrode and the second touch control electrode generate a touch sensing signal.

4. The display panel according to claim 3, wherein the first touch control electrode and the second touch control electrode are formed in a same layer.

5. The display panel according to claim 3, wherein the first electrode line B has a slit extending along the first side between the first light-emitting unit and the second light-emitting unit, and the branch line is branched from the side line and enters the slit.

6. The display panel according to claim 1, wherein the first electrode line B receives a control signal from the connecting line, the first electrode line A receives an image control pulse signal, and the control signal and the image control pulse signal have a time difference.

7. The display panel according to claim 6, wherein the image control pulse signal is obtained by combining an image control basis signal and a compensation pulse signal, and the compensation pulse signal corresponds to time series of a sensing scanning pulse signal.

8. The display panel according to claim 1, wherein the first light-emitting unit and the second light-emitting unit respectively comprise:
a first type semiconductor layer;
a second type semiconductor layer, disposed on a first-type semiconductor layer;
an active layer, disposed between the first type semiconductor layer and the second type semiconductor layer; and
wherein the first electrode A and the second electrode A are disposed on the second type semiconductor layer respectively, and the first electrode B and the second electrode B are disposed on the first type semiconductor layer respectively.

9. A display panel, comprising:
a first light-emitting unit, comprising a first electrode A and a first electrode B;
a second light-emitting unit, comprising a second electrode A and a second electrode B;
a third light-emitting unit, comprising a third electrode A and a third electrode B;
a fourth light-emitting unit, comprising a fourth electrode A and a fourth electrode B;
a first electrode line A, electrically connected to the first electrode A;
a first electrode line B, arranged between the first light-emitting unit and the second light-emitting unit, between the third light-emitting unit and the fourth light-emitting unit, extending from between the first light-emitting unit and the second light-emitting unit to between the third light-emitting unit and the fourth light-emitting unit, and connecting to the first electrode B, the second electrode B, the third electrode B, and the fourth electrode B respectively; and
a connecting line extending between the first light-emitting unit and the third light-emitting unit and between the second light-emitting unit and the fourth light-emitting unit, wherein the first electrode line B crosses over the connecting line, and is electrically connected to the connecting line;
wherein in a display stage, the connecting line controls grayscales of the first light-emitting unit, the second light-emitting unit, the third light-emitting unit, and the fourth light-emitting unit, and in a touch control stage, the connecting line as a first touch control electrode is adapted to generate touch sensing signal.

10. The display panel according to claim 9, further comprising:
a second touch control electrode, comprising:
a main line, substantially arranged parallel along the second light-emitting unit extending to the fourth light-emitting unit;
a side line, connected to the main line, and substantially perpendicular to the main line; and
a branch line, connected to the side line, and substantially parallel to the main line;
wherein the first touch control electrode and the second touch control electrode generate a touch sensing signal.

11. The display panel according to claim 10, wherein the first touch control electrode and the second touch control electrode are formed in a same layer.

12. The display panel according to claim 10, wherein the first electrode line B has a slit extending along the first side between the first light-emitting unit and the second light-emitting unit, and the branch line is branched from the side line and enters the slit.

13. The display panel according to claim 9, wherein the first electrode line B receives a control signal from the connecting line, the first electrode line A receives an image control pulse signal, and the control signal and the image control pulse signal have a time difference.

14. The display panel according to claim 13, wherein the image control pulse signal is obtained by combining an image control basis signal and a compensation pulse signal, and the compensation pulse signal corresponds to time series of a sensing scanning pulse signal.

15. The display panel according to claim 9, wherein the first light-emitting unit and the second light-emitting unit respectively comprise:
a first type semiconductor layer;
a second type semiconductor layer, disposed on a first-type semiconductor layer;
an active layer, disposed between the first type semiconductor layer and the second type semiconductor layer; and
wherein the first electrode A and the second electrode A are connected to the second type semiconductor layer respectively, and the first electrode B and the second electrode B are connected to the first type semiconductor layer respectively.

* * * * *